(12) United States Patent
Kwak et al.

(10) Patent No.: US 8,654,564 B2
(45) Date of Patent: Feb. 18, 2014

(54) RESISTIVE MEMORY AND RELATED METHOD OF OPERATION

(75) Inventors: Donghun Kwak, Hwaseong-Si (KR); Cheonan Lee, Hwaseong-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 19 days.

(21) Appl. No.: 13/598,994

(22) Filed: Aug. 30, 2012

(65) Prior Publication Data

US 2013/0208528 A1    Aug. 15, 2013

(30) Foreign Application Priority Data

Feb. 13, 2012  (KR) .................. 10-2012-0014425

(51) Int. Cl.
| | | |
|---|---|---|
| G11C 11/00 | (2006.01) | |
| G11C 7/00 | (2006.01) | |
| G11C 7/22 | (2006.01) | |

(52) U.S. Cl.
USPC ....... 365/148; 365/163; 365/189.16; 365/218

(58) Field of Classification Search
USPC .......................................... 365/148
See application file for complete search history.

(56) References Cited

U.S. PATENT DOCUMENTS

| | | | |
|---|---|---|---|
| 6,614,693 B1 | 9/2003 | Lee et al. | |
| 7,345,923 B2 | 3/2008 | Kim | |
| 7,633,803 B2 | 12/2009 | Lee | |
| 7,701,769 B2 | 4/2010 | Lue et al. | |
| 7,729,163 B2 * | 6/2010 | Ramani et al. | 365/163 |
| 7,821,827 B2 | 10/2010 | Kim | |
| 8,040,721 B2 | 10/2011 | Thorp et al. | |
| 8,300,449 B2 * | 10/2012 | Lin et al. | 365/148 |
| 2009/0046495 A1 * | 2/2009 | Shimaoka et al. | 365/148 |
| 2010/0097842 A1 * | 4/2010 | Hwang | 365/148 |
| 2010/0097849 A1 * | 4/2010 | Hwang et al. | 365/163 |
| 2010/0124121 A1 | 5/2010 | Seo | |
| 2011/0080791 A1 * | 4/2011 | Kim et al. | 365/185.22 |
| 2013/0094275 A1 * | 4/2013 | Chen | 365/148 |

* cited by examiner

*Primary Examiner* — Son Mai
(74) *Attorney, Agent, or Firm* — Volentine & Whitt, PLLC

(57) ABSTRACT

A resistive memory device comprises a memory cell array comprising a plurality of memory cells connected to a plurality of word lines and a plurality of bit lines, a row selector connected to the plurality of word lines, and a column selector connected to the plurality of bit lines. In a program or erase operation, the row selector provides a selected word line with program or erase pulse and a verification pulse in each of multiple program loops, wherein the verification pulse has a substantially fixed level through the program loops and the program or erase pulse has a negative value that decreases incrementally between successive program loops.

20 Claims, 21 Drawing Sheets

RESISTIVE MEMORY AND RELATED METHOD OF OPERATION

CROSS-REFERENCE TO RELATED APPLICATIONS

This application claims priority under 35 U.S.C. §119 to Korean Patent Application No. 10-2012-0014425 filed on Feb. 13, 2012, the subject matter of which is hereby incorporated by reference.

BACKGROUND OF THE INVENTION

The inventive concept relates generally to electronic memory technologies. More particularly, the inventive concept relates to resistive memory devices, systems incorporating the resistive memory devices, and related methods of operation.

Semiconductor memory devices can be roughly divided into two categories according to whether they retain stored data when disconnected from power. These categories include volatile memory devices, which lose stored data when disconnected from power, and nonvolatile memory devices, which retain stored data when disconnected from power. Examples of volatile memory devices include static random access memory (SRAM), dynamic RAM (DRAM), and synchronous DRAM (SDRAM). Examples of nonvolatile memory devices include read only memory (ROM), programmable ROM (PROM), electrically programmable ROM (EPROM), electrically erasable and programmable ROM (EEPROM), flash memory, phase-change RAM (PRAM), magnetic RAM (MRAM), resistive RAM (RRAM), and ferroelectric RAM (FRAM). Some of the above types of memory can be further divided into subcategories. For example, flash memory can be divided into a NOR type and a NAND type memories.

Like many other forms of nonvolatile memory, resistive memory devices are the subject of ongoing research efforts designed to improve their performance and reliability, among other things. These efforts may take a variety of forms, such as the development of improved memory cells, as well as improved methods of programming or erasing existing memory cells.

SUMMARY OF THE INVENTION

In one embodiment of the inventive concept, a resistive memory device comprises a memory cell array comprising a plurality of memory cells connected to a plurality of word lines and a plurality of bit lines, a row selector connected to the plurality of word lines, and a column selector connected to the plurality of bit lines. In a program operation, the row selector provides a selected word line with program pulse and a verification pulse in each of multiple program loops, wherein the verification pulse has a substantially fixed level through the program loops and the program pulse has a negative value that decreases incrementally between successive program loops.

In another embodiment of the inventive concept, a resistive memory device comprises a memory cell array comprising a plurality of memory cells connected to a plurality of word lines and a plurality of bit lines, a row selector connected to the plurality of word lines, and a column selector connected to the plurality of bit lines. In an erase operation, the column selector provides a selected bit line with an erase pulse and a verification pulse in each of multiple program loops, wherein the verification pulse has a substantially fixed level through the program loops and the erase pulse has a negative value that decreases incrementally between successive program loops.

In another embodiment of the inventive concept, a method of operating a resistive memory device comprises performing a plurality of program loops each comprising applying a program pulse and a verification pulse to selected memory cells, wherein the verification pulse has a substantially fixed level through the plurality of program loops and the program pulse has a value that decreases incrementally between successive program loops.

These and other embodiments of the inventive concept can potentially improve the performance and reliability of resistive memory devices, including certain aspects of program and erase operations.

BRIEF DESCRIPTION OF THE DRAWINGS

The attached drawings illustrate selected embodiments of the inventive concept. In the drawings, like reference numbers indicate like features.

DETAILED DESCRIPTION

Figure 1:
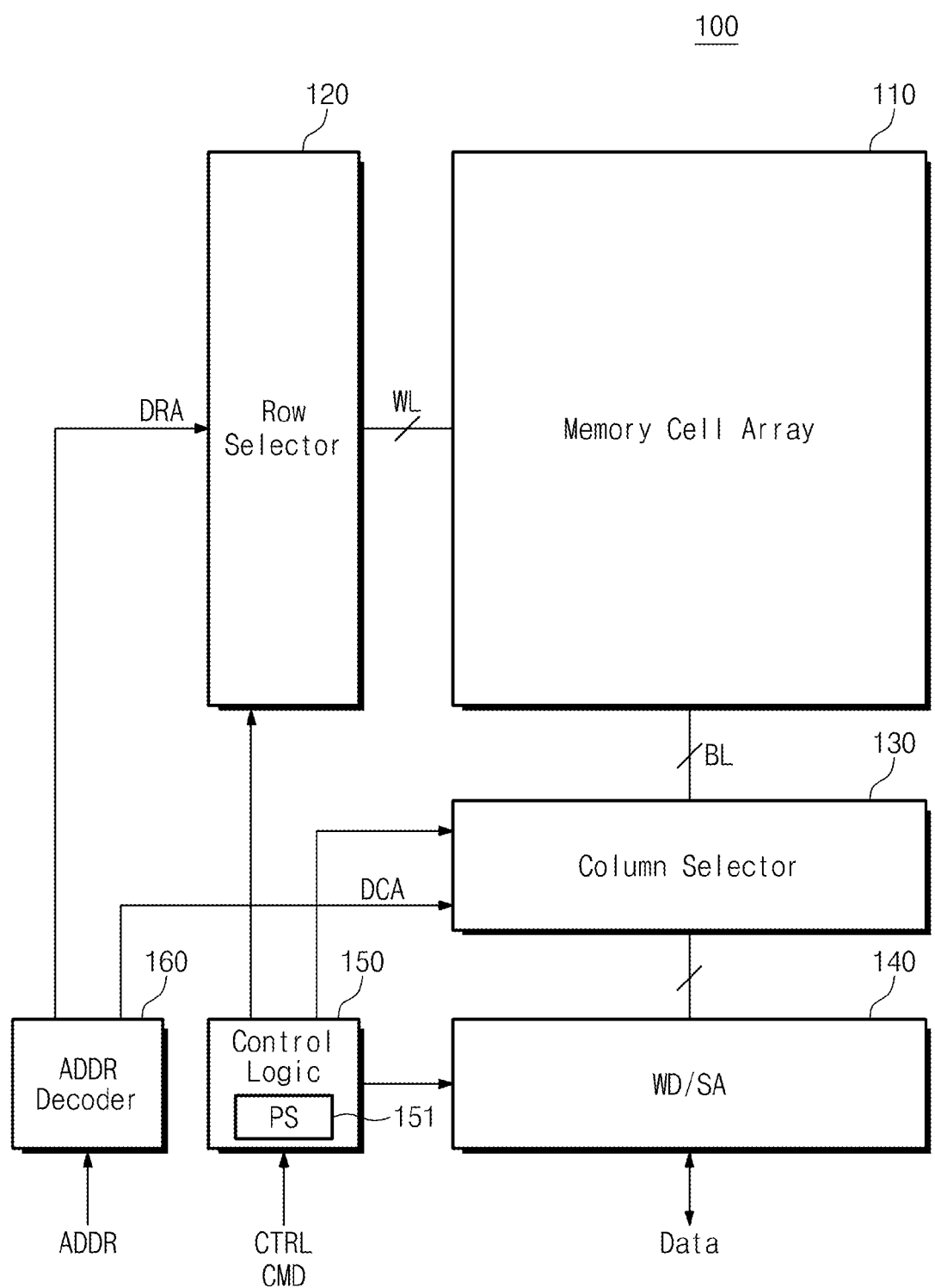
FIG. 1 is a block diagram of a resistive memory device according to an embodiment of the inventive concept.

Selected embodiments of the inventive concept are described below with reference to the accompanying drawings. These embodiments are presented as teaching examples and should not be construed to limit the scope of the inventive concept.

In the description that follows, the terms "first", "second", "third", etc., are used to describe various features; however, the described features should not be limited by these terms. Rather, these terms are used merely to distinguish between different features. Thus, a first feature could be termed a second feature and vice versa without changing the meaning of the relevant description.

Spatially relative terms, such as "beneath", "below", "lower", "under", "above", "upper" and the like, may be used herein for ease of description to describe relationships between different features as illustrated in the drawings. However, the spatially relative terms are intended to encompass different orientations of a device in use or operation in addition to the orientation depicted in the drawings. For example, if a device in the figures is turned over, features described as "below" or "beneath" or "under" other elements or features would then be oriented "above" the other features. Thus, the terms "below" and "under" can encompass both an orientation of above and below. A device may be otherwise oriented (rotated 90 degrees or at other orientations) and the spatially relative descriptors interpreted accordingly. In addition, where a layer is referred to as being "between" two layers, it can be the only layer between the two layers, or one or more intervening layers may also be present.

The terminology used herein is for the purpose of describing particular embodiments only and is not intended to limit the inventive concept. The singular forms "a", "an" and "the" are intended to encompass the plural forms as well, unless the context clearly indicates otherwise. Terms such as "comprises", "includes", "has", etc., where used herein, indicate the presence of stated features but do not preclude the presence or addition of other features. The term "and/or" indicates any and all combinations of one or more of the associated listed items.

Where a feature is referred to as being "on", "connected to", "coupled to", or "adjacent to" another feature, it can be directly on, connected, coupled, or adjacent to the other feature, or intervening features may be present. In contrast, where a feature is referred to as being "directly on," "directly connected to", "directly coupled to", or "immediately adjacent to" another feature, there are no intervening features present.

Unless otherwise defined, all terms (including technical and scientific terms) used herein have the same meaning as commonly understood by one of ordinary skill in the art. Terms such as those defined in commonly used dictionaries should be interpreted as having a meaning that is consistent with their meaning in the context of the relevant art and/or the present specification and should not be interpreted in an idealized or overly formal sense unless expressly so defined herein.

The term "selected bit line" or "selected bit lines" may indicate a bit line or bit lines connected to a cell transistor to be programmed, erased, or read from among a plurality of bit lines. The term "unselected bit line" or "unselected bit lines" may indicate a bit line or bit lines connected to a cell transistor not to be programmed, erased, or read from among a plurality of bit lines.

The term "selected word line" or "selected word lines" may indicate a word line or word lines connected to a cell transistor to be programmed, erased, or read from among a plurality of word lines. The term "unselected word line" or "unselected word lines" may indicate a word line or word lines connected to a cell transistor not to be programmed, erased, or read from among a plurality of word lines.

The term "selected memory cell" or "selected memory cells" may indicate a memory cell or memory cells to be programmed, erased, or read from among a plurality of memory cells. The term "unselected memory cell" or "unselected memory cells" may indicate the remaining memory cell or memory cells of the plurality of memory cells other than the selected memory cell or memory cells.

In the description that follows, certain aspects of the inventive concept are described with reference to resistive memory devices (ReRAMs). However, the inventive concept is not limited to resistive memory devices, and it can be embodied in other forms such as Electrically Erasable and Programmable ROM (EEPROM), NAND flash memory, NOR flash memory, Phase-change RAM (PRAM), Magnetic RAM (MRAM), and Ferroelectric RAM (FRAM), for example.

FIG. 1 is a block diagram illustrating a resistive memory device 100 according to an embodiment of the inventive concept.

Referring to FIG. 1, resistive memory device 100 comprises a memory cell array 110, a row selector 120, a column selector 130, a write driver and sense amplifier block 140, control logic 150, and an address decoder 160.

Memory cell array 110 is connected to row decoder 120 via word lines, and to column selector 130 via bit lines. Memory cell array 110 comprises a plurality of memory cells. Memory cells arranged in a row direction are connected to word lines WL, and memory cells arranged in a column direction are connected to bit lines BL. Memory cell array 110 comprises multiple memory cells each storing one or more bits of data.

Row selector 120 is connected to memory cell array 110 via word lines WL. Row selector 120 operates under control of control logic 150. Row selector 120 selects word lines WL in response to a decoded row address DRA from address decoder 160. Row selector 120 receives power (e.g., a voltage or a current) from control logic 150 and transfers it to word lines WL.

Column selector 130 is connected to memory cell array 110 via bit lines BL. Column selector 130 operates under control of control logic 150. Column selector 130 selects bit lines BL in response to a decoded column address DCA from address decoder 160. Column selector 130 receives power (e.g., a voltage or a current) from control logic 150 and transfers it to bit lines BL.

Write driver and sense amplifier block 140 is connected to bit lines BL via column selector 130. Write driver and sense amplifier block 140 operates under control of control logic 150. Write driver and sense amplifier block 140 is configured to write data at memory cells connected to bit lines selected by column selector 130 or to read data therefrom. Data read by write driver and sense amplifier block 140 is output to an external device. Data provided to write driver and sense amplifier block 140 is written in selected memory cells.

Control logic 150 is configured to control operations of resistive memory device 100. For example, control logic 150 operates responsive to input control signal CTRL and command CMD, and it controls reading, writing, or erasing of resistive memory device 100.

Control logic 150 comprises a power supply 151. A power (e.g., a voltage or a current) generated by control logic 150 is supplied to row selector 120, column selector 130, or write driver and sense amplifier block 140. Writing, reading, or erasing of memory cells is executed using power generated by power supply 151.

Address decoder 160 decodes a row address of an input address ADDR and provides the decoded row address to row selector 120. Address decoder 160 also decodes a column address of input address ADDR and provides the decoded column address to column selector 130.

Figure 2:
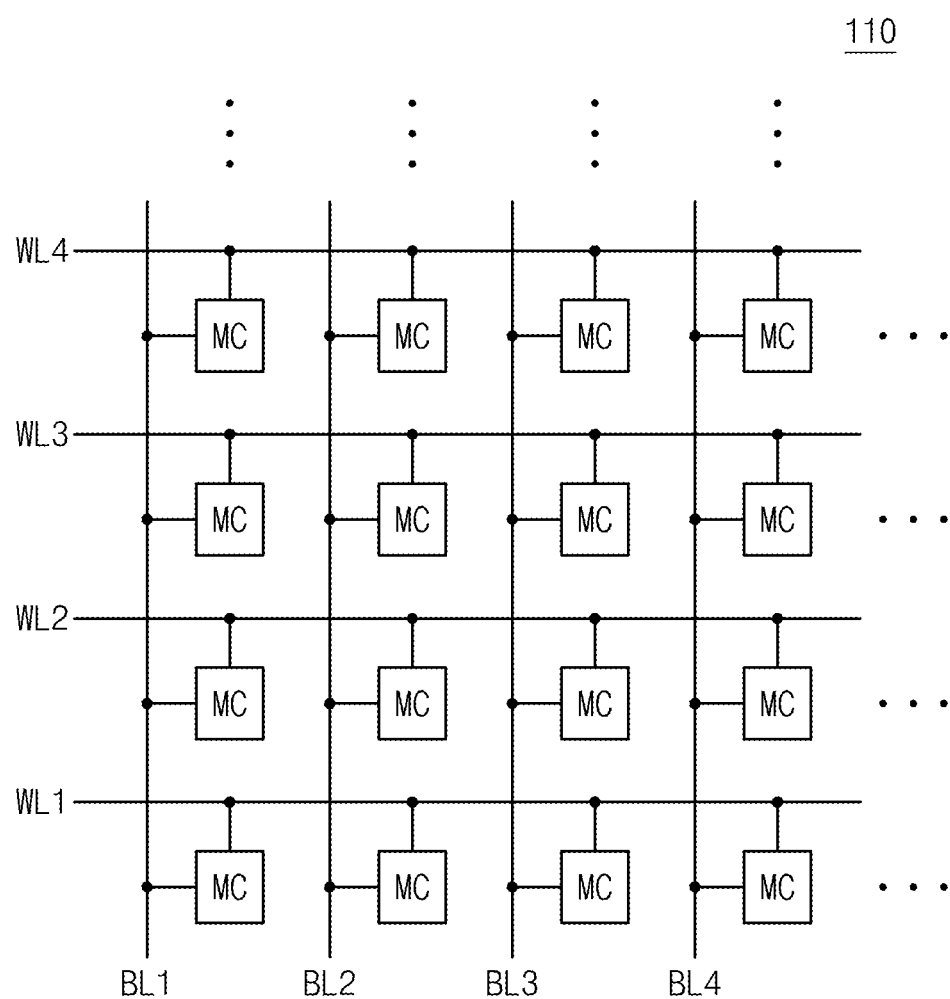
FIG. 2 is a diagram of a memory cell array in the resistive memory device of FIG. 1 according to an embodiment of the inventive concept.

FIG. 2 is a diagram of memory cell array 110 in FIG. 1 according to a representative embodiment.

Referring to FIG. 2, memory cells MC are connected to word lines WL1 to WL4 and bit lines BL1 to BL4. Although FIG. 2 shows an example that memory cells MC are connected to four word lines WL1 to WL4 and four bit lines BL1 to BL4, the inventive concept is not limited thereto.

Figure 3:
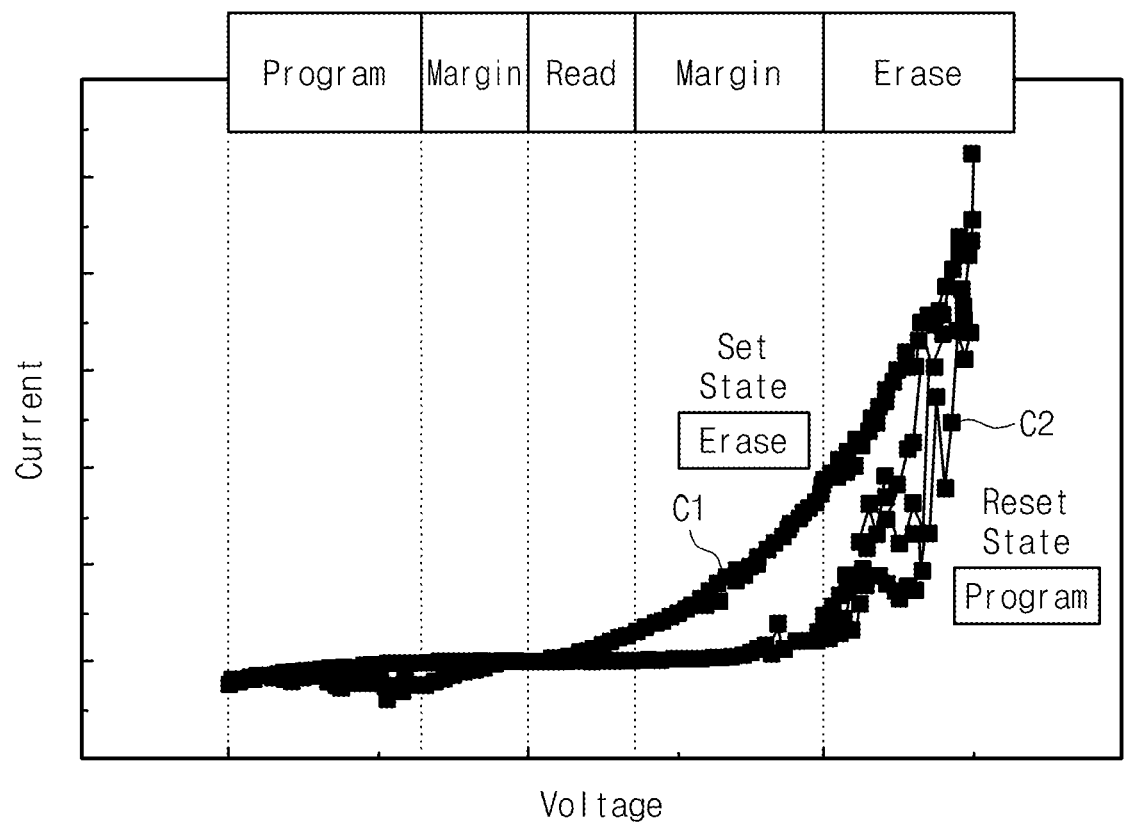
FIG. 3 is a graph illustrating hysteresis curves of memory cells in the memory cell array of FIG. 2.

FIG. 3 is a graph illustrating hysteresis curves of memory cells MC of FIG. 2. In FIG. 3, a horizontal axis represents voltage and a vertical axis represents current. At a top of FIG. 3, conditions where memory cells MC transition between a set state (or erase state) and a reset state (or program state) are illustrated using voltage periods.

A first curve C1 is a voltage-current curve of memory cells having a set state (or, an erase state). A second curve C2 is a voltage-current curve of memory cells having a reset state (or, a program state).

Where the same voltage (e.g., a voltage having a level belonging to a read period) is applied to memory cells MC, the amount of a current flowing via a memory cell MC having the set state (or, an erase state) is greater than that of a memory cell having the reset state (e.g., a program state). That is, a memory cell MC in the reset state (or, a program state) may have a resistance value larger than that of a memory cell in the set state (or, an erase state).

When a voltage corresponding to an erase period is applied to memory cells having a reset state (or, a program state), states of the memory cells are changed into a set state (or, an erase state). Alternatively, when a current corresponding to a voltage of an erase period is applied to memory cells having a reset state (or, a program state), states of the memory cells are changed into a set state (or, an erase state).

Where a voltage corresponding to a program period is applied to memory cells having the set state, states of the memory cells are changed into the reset state. Alternatively, where a current corresponding to a voltage of a program period is applied to memory cells having a set state (or, an erase state), states of the memory cells are changed into a reset state (or, a program state).

In some embodiments, a voltage bias for programming is opposite to a voltage bias for erasing. In programming, a word line voltage is typically lower than a bit line voltage. In erasing, a word line voltage is higher than a bit line voltage. Similarly, in some embodiments, a current bias at programming is opposite to a current bias at erasing. At programming, a current may flow to a word line from a bit line via a memory cell. At erasing, a current may flow to a bit line from a word line via a memory cell.

Figure 4:
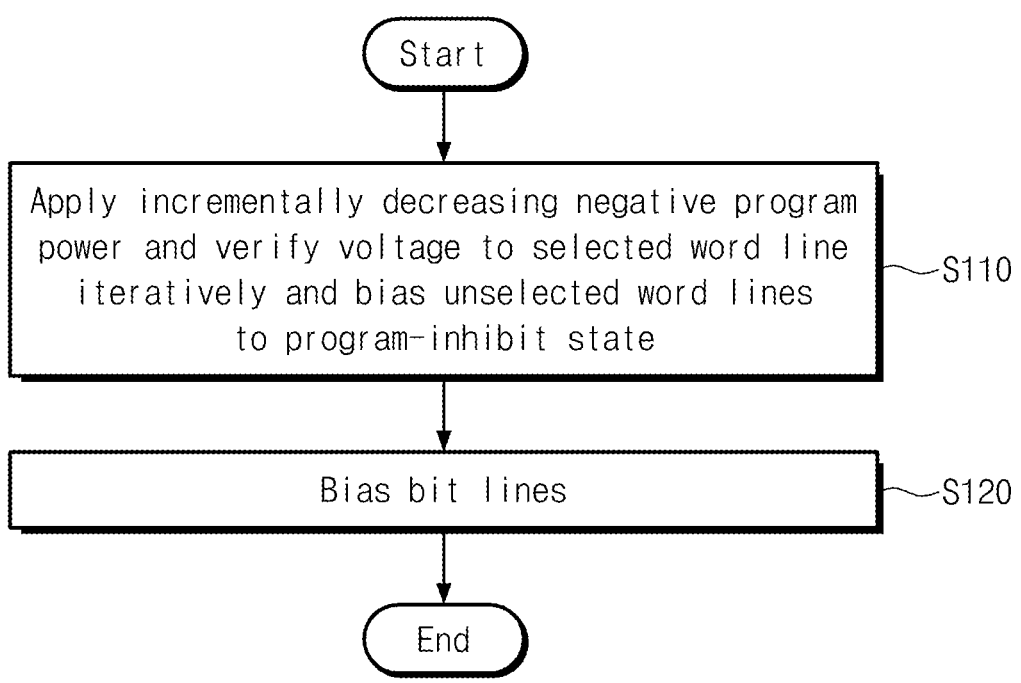
FIG. 4 is a flowchart illustrating a method of programming a resistive memory device according to an embodiment of the inventive concept.

FIG. 4 is a flowchart illustrating a method of programming a resistive memory device according to an embodiment of the inventive concept.

Referring to FIG. 4, in operation S110, an incrementally decreasing negative program power and a verification voltage are supplied to a selected word line in turn, and unselected word lines are set to a program-inhibition state. The program power may be a program voltage or a program current. The verification voltage may have a fixed level. In operation S120, bit lines are biased.

Figure 5:
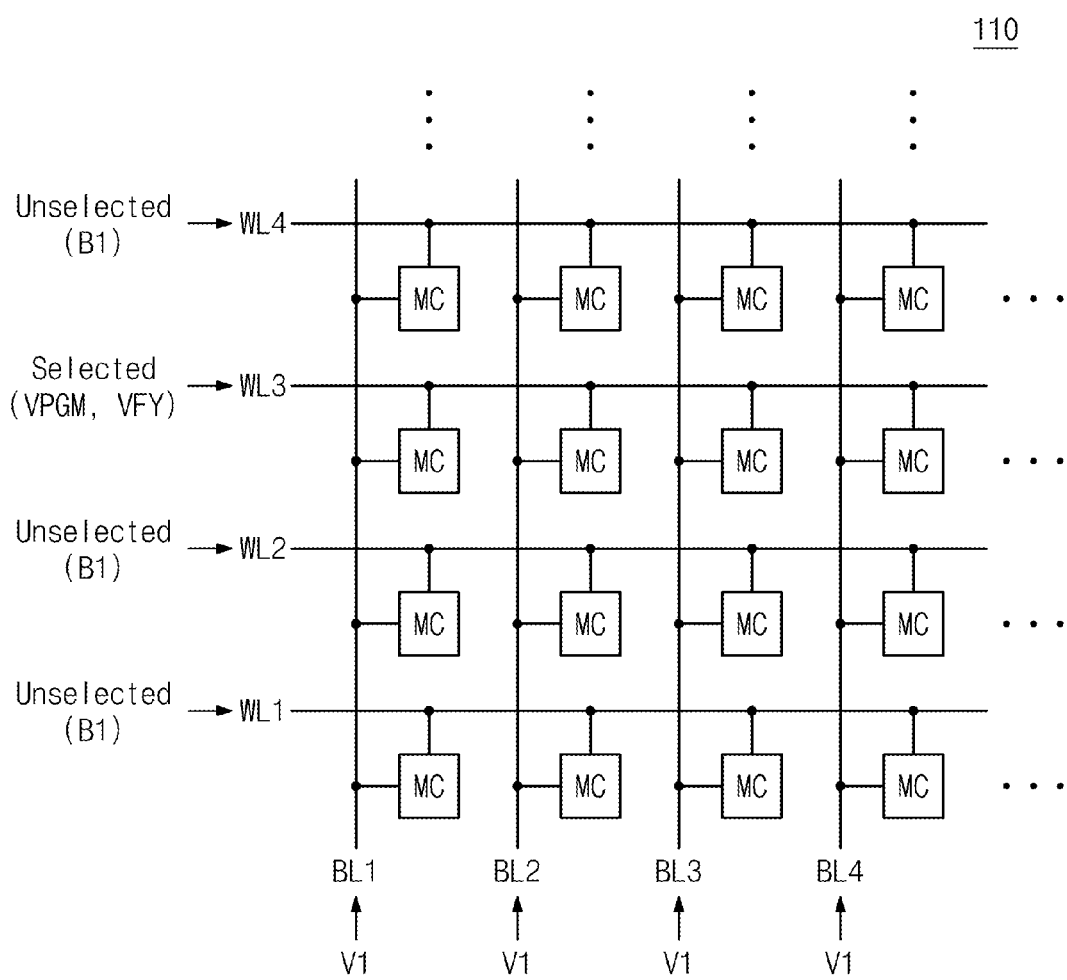
FIG. 5 is a diagram illustrating bias conditions of a memory cell array in the method of FIG. 4 according to an embodiment of the inventive concept.

FIG. 5 is a diagram illustrating bias conditions of a memory cell array in the method of FIG. 4 according to an embodiment of the inventive concept. In the description of FIG. 5, it is assumed that a third word line WL3 is selected.

Referring to FIG. 5, a program voltage VPGM and a verification voltage VFY are applied to third word line WL3 in turn. Program voltage VPGM is a negative voltage that gradually decreases in successive iterations. Verification voltage VFY is a positive voltage having a fixed level. The verification voltage can be a lowest voltage, a highest voltage, an intermediate voltage, or any voltage of a read period of a hysteresis curve in FIG. 3.

A first voltage V1 is applied to bit lines BL1 to BL4. First voltage V1 is a ground voltage or a voltage higher than program voltage VPGM. Current flows to third word line WL3 from bit lines BL1 to BL4 via memory cells connected to third word line WL3. Program voltage VPGM gradually decreases, and as it decreases, memory cells connected to third word line WL3 are gradually programmed. That is, the memory cells connected to third word line WL3 are programmed in an incremental step pulse programming manner. Thus, the memory cells connected to third word line WL3 are programmed to have a resistance value in a normal range even with deterioration.

Figure 6:
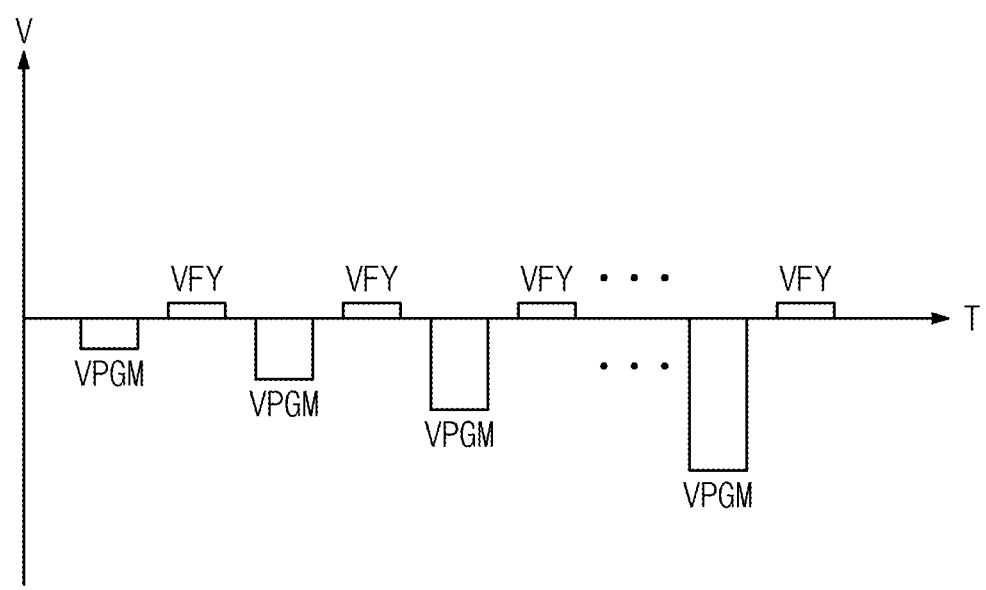
FIG. 6 is a diagram illustrating a program voltage and a verification voltage applied to a selected word line in the method of FIG. 4 according to an embodiment of the inventive concept.

FIG. 6 is a diagram illustrating a program voltage VPGM and a verification voltage VFY applied to a selected word line. In FIG. 6, a horizontal axis represents time and a vertical axis represents voltage.

Referring to FIG. 6, a program voltage VPGM and a verification voltage VFY are applied to a selected word line WL3 in turn. Program voltage VPGM has a negative level that gradually decreases, and verification voltage VFY has a positive fixed level.

Figure 7:
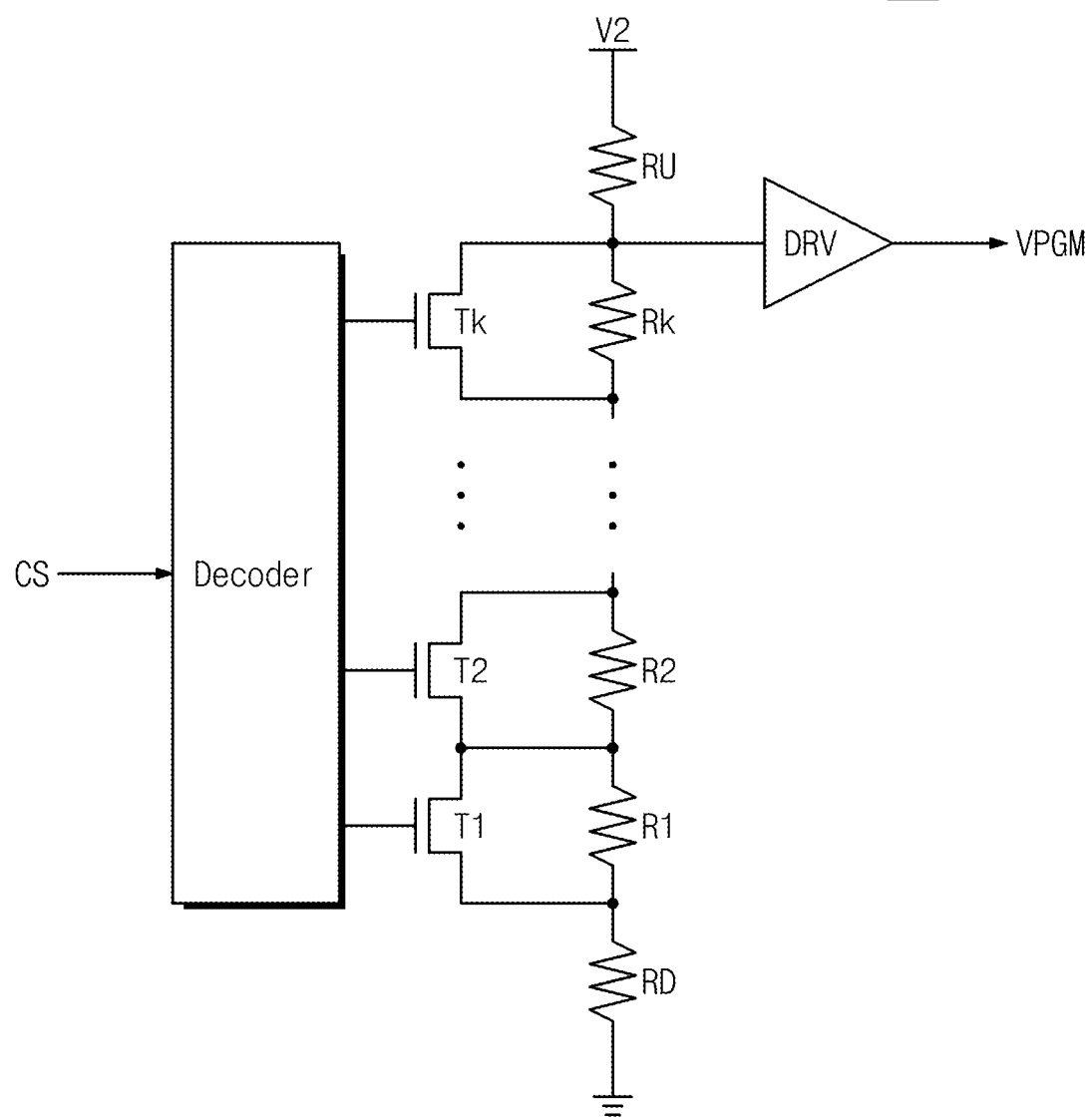
FIG. 7 is a circuit diagram of a power supply in the resistive memory device of FIG. 1 according to an embodiment of the inventive concept.

FIG. 7 is a circuit diagram of power supply 151 of FIG. 1 according to an embodiment of the inventive concept.

Referring to FIG. 7, power supply 151 comprises a decoder, transistors T1 to Tk, resistors RD, R1 to RK, and RU, and a driver DRV.

Resistors RD, R1 to RK, and RU are connected in series between a node supplied with a second voltage V2 and ground. Second voltage V2 is a negative voltage. Transistors T1 to Tk are connected in parallel with resistors R1 to Rk, respectively. The decoder controls transistors T1 to Tk in response to a control signal CS provided from control logic 150. Driver DRV receives a voltage from one of connection nodes of resistors RD, R1 to RK, and RU and outputs it to row selector 120 as a program voltage VPGM.

As transistors T1 to Tk are selectively turned on by the decoder, a voltage transferred to driver DRV may vary. The decoder controls transistors T1 to Tk under control of control logic 150 such that program voltage VPGM from driver DRV has a negative level gradually decreasing. Driver DRV is typically connected to a connection node of resistors RU and Rk to output program voltage VPGM, but it is not limited to this configuration.

Figure 8:
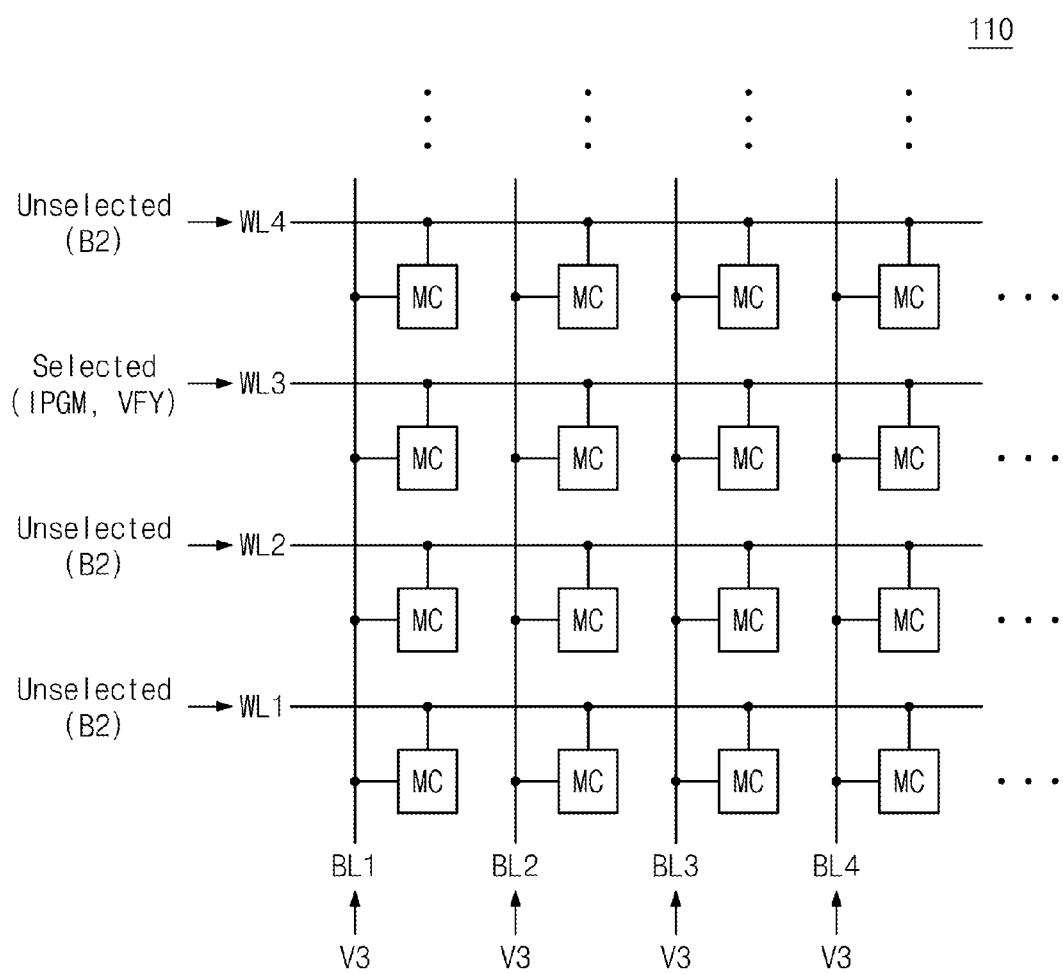
FIG. 8 is a diagram illustrating bias conditions of a memory cell array in the method of FIG. 4 according to another embodiment of the inventive concept.

FIG. 8 is a diagram illustrating another bias condition of a memory cell array in the method of FIG. 4 according to an embodiment of the inventive concept. In the description of FIG. 8, it is assumed that a third word line WL3 is selected.

Referring to FIG. 8, a program current IPGM and a verification voltage VFY are applied to third word line WL3 in turn. Program current IPGM is a negative current that gradually decreases. Verification voltage VFY is a positive voltage having a fixed level. The verification voltage can be a lowest voltage, a highest voltage, an intermediate voltage, or any voltage of a read period of a hysteresis curve in FIG. 3.

A third voltage V3 is applied to bit lines BL1 to BL4. Third voltage V3 can be a ground voltage or any other voltage. A current flows to third word line WL3 from bit lines BL1 to BL4 via memory cells connected to third word line WL3. Program current IPGM gradually decreases. As program current IPGM gradually decreases, memory cells connected to third word line WL3 are gradually programmed. That is, the memory cells connected to third word line WL3 are programmed in the incremental step pulse program manner. Thus, the memory cells connected to third word line WL3 are programmed to have a resistance value within a normal range even with deterioration.

Figure 9:
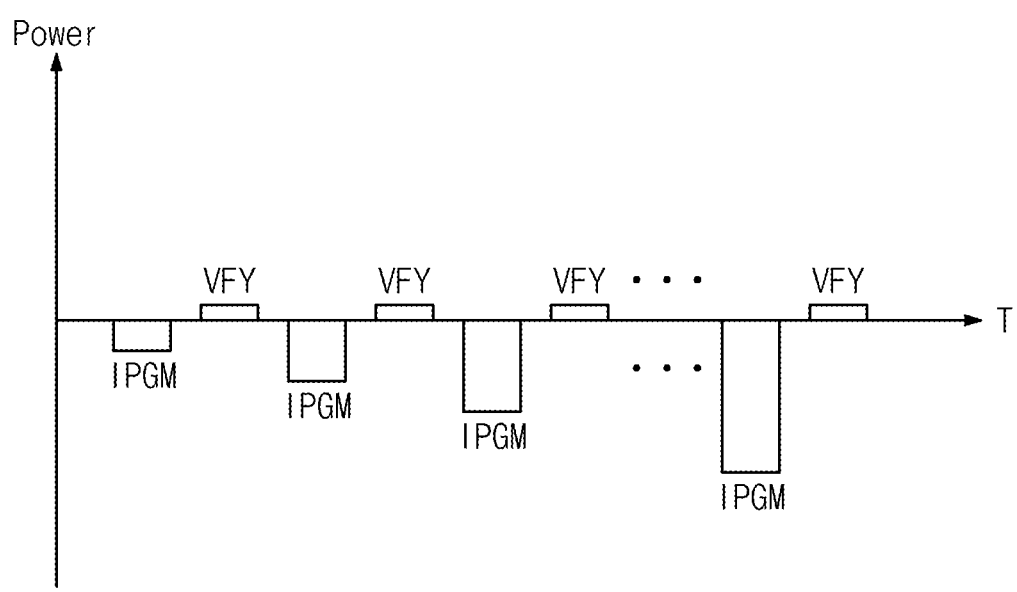
FIG. 9 is a diagram illustrating a program voltage and a verification voltage applied to a selected word line in the method of FIG. 4 according to another embodiment of the inventive concept.

FIG. 9 is a diagram illustrating a program voltage VPGM and a verification voltage VFY applied to a selected word line. In FIG. 9, a horizontal axis represents time and a vertical axis represents voltage.

Referring to FIG. 9, a program current IPGM and a verification voltage VFY are applied to a selected word line WL3 in turn. Program current IPGM has a negative current that gradually decreases. Verification voltage VFY has a positive fixed level.

Figure 10:
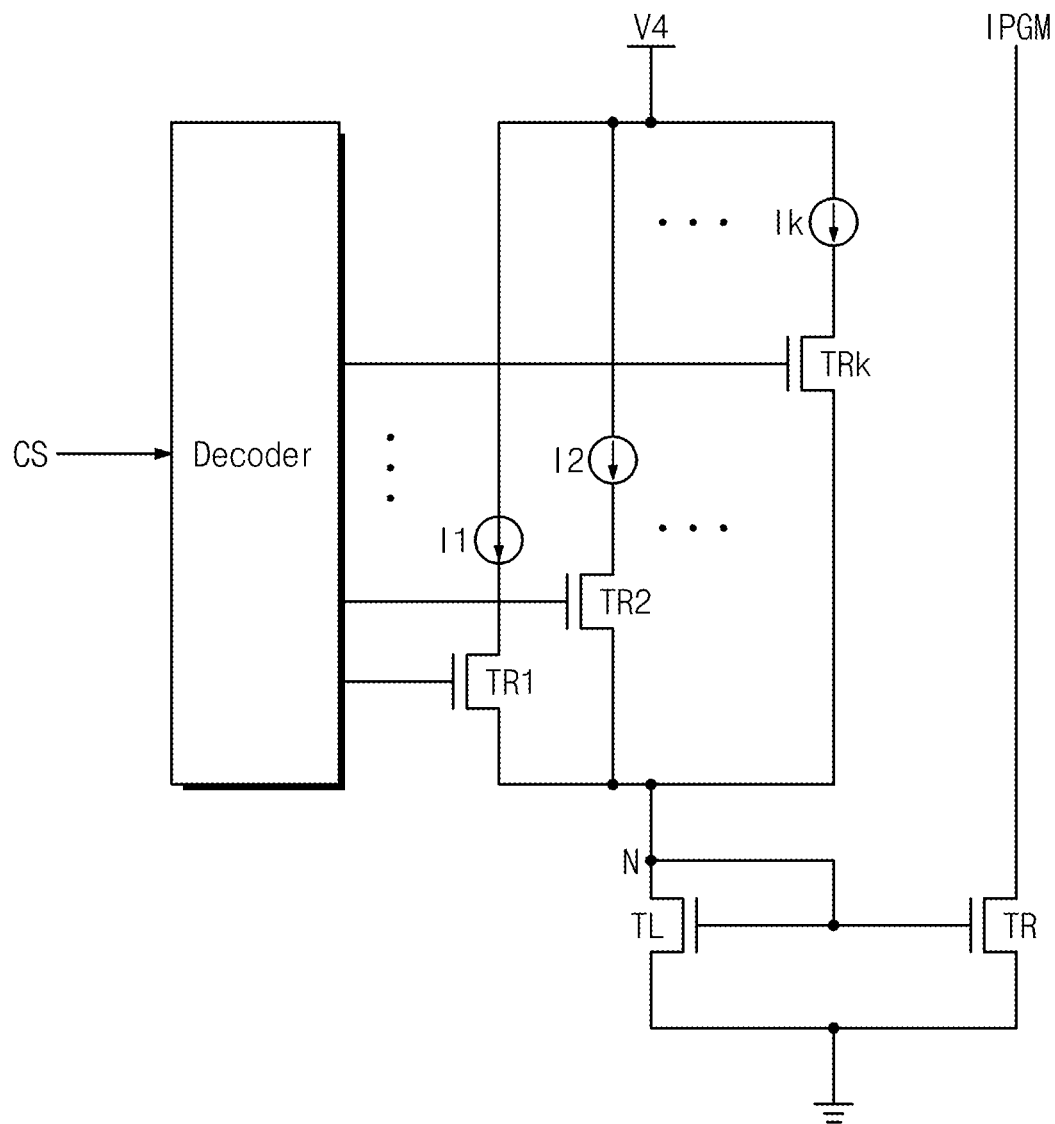
FIG. 10 is a circuit diagram of a power supply in the resistive memory device of FIG. 1 according to another embodiment of the inventive concept.

FIG. 10 is a circuit diagram of power supply 151 according to another embodiment of the inventive concept.

Referring to FIG. 10, power supply 151 comprises a decoder, transistors TL, TR, TR1 to TRk, and current sources I1 to Ik.

Transistors TR1 to TRk are paired with current sources I1 to Ik, respectively. Transistor and current source pairs are connected in parallel between a node supplied with a fourth voltage V4 and a node N of transistor TL. The decoder controls transistors TR1 to TRk in response to a control signal CS provided from control logic 150.

Transistors TL and TR form a current minor that operates as a current sink to discharge a current corresponding to a current flowing via node N. Current discharged via the current mirror is transferred to a row decoder 120 as a program current IPGM.

As transistors TR1 to TRk are selectively turned on by the decoder, the amount of current flowing through node N may vary. The decoder controls transistors TR1 to TRk under the control of control logic 150 such that a negative program current IPGM gradually decreasing is generated.

Figure 11:
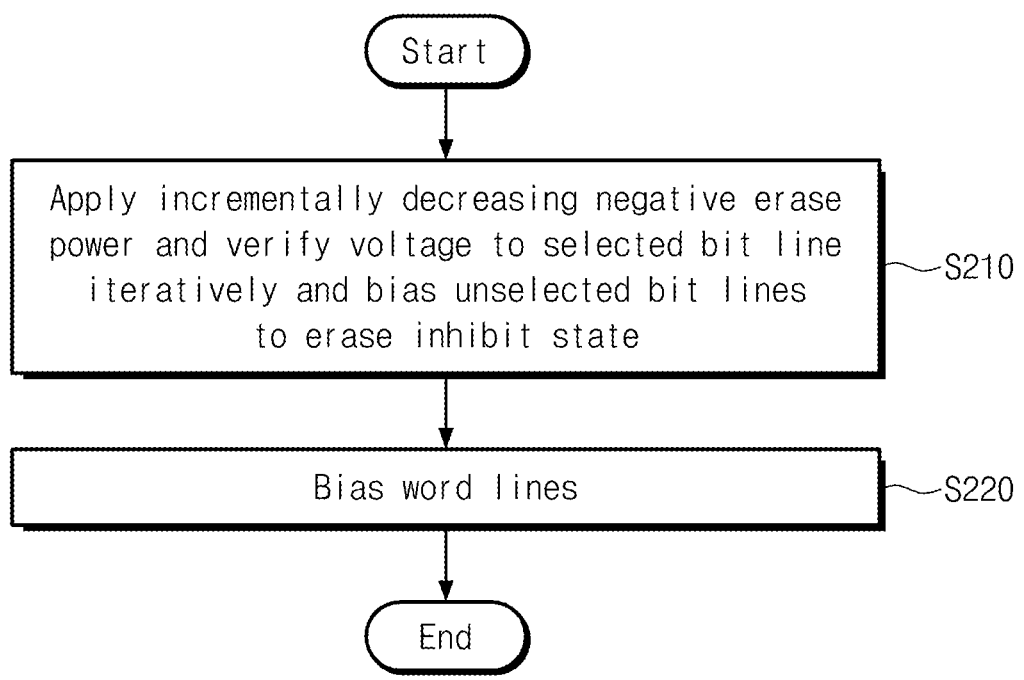
FIG. 11 is a flowchart illustrating a method of erasing a resistive memory device according to an embodiment of the inventive concept.

FIG. 11 is a flowchart illustrating a method of erasing a resistive memory device according to an embodiment of the inventive concept.

Referring to FIG. 11, in operation S210, an incrementally decreasing negative erase power and a verification voltage are supplied to a selected word line in turn, and unselected word lines are set to an erase-inhibition state. The erase power may be an erase voltage or an erase current. The verification voltage has a fixed level. In operation S220, bit lines are biased.

Figure 12:
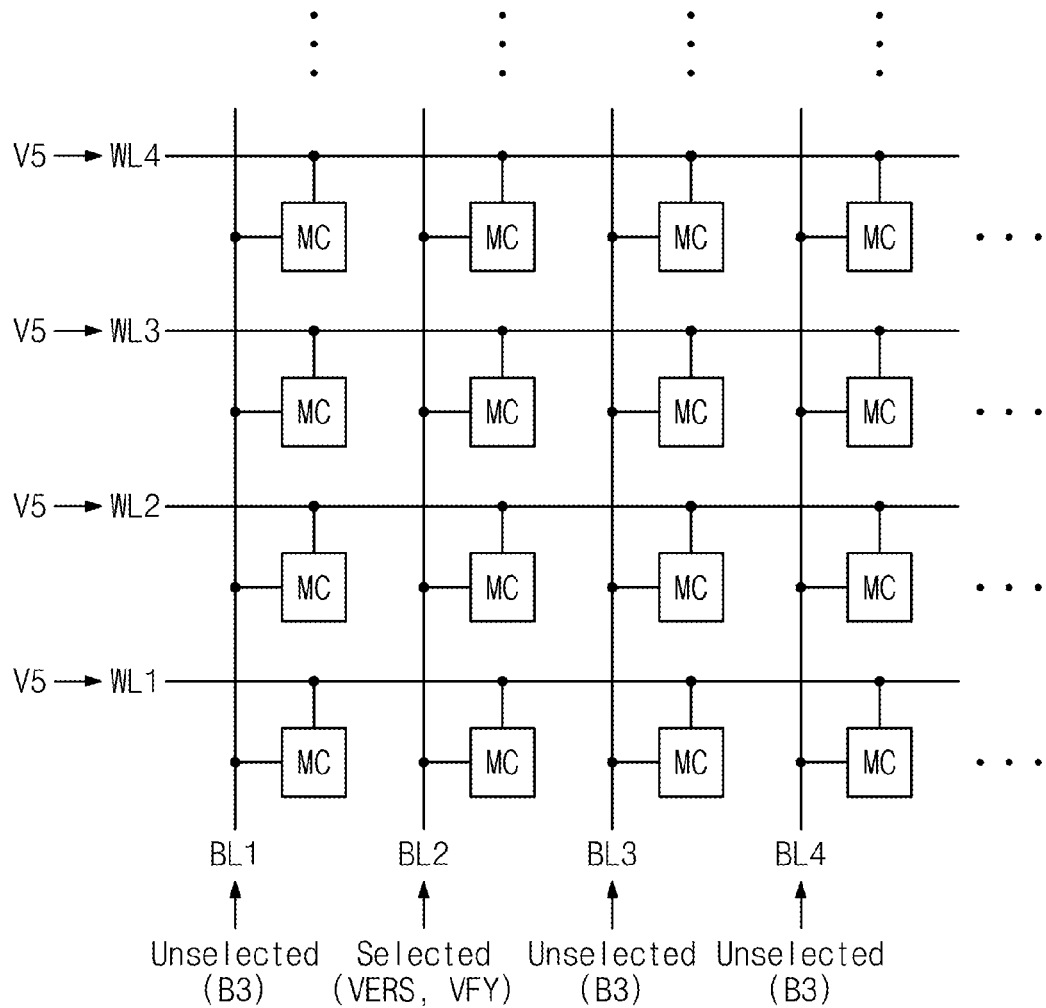
FIG. 12 is a diagram illustrating bias conditions of a memory cell array in the method of FIG. 11 according to an embodiment of the inventive concept.

FIG. 12 is a diagram illustrating bias conditions of a memory cell array in the method of FIG. 11. In the description of FIG. 12, it is assumed that a second bit line BL2 is selected.

Referring to FIG. 12, an erase voltage VERS and a verification voltage VFY are applied to second bit line BL2 in turn. Erase voltage VERS is a negative current that gradually decreases. Verification voltage VFY is a positive voltage having a fixed level. The verification voltage can be a lowest voltage, a highest voltage, an intermediate voltage, or any voltage of a read period of a hysteresis curve in FIG. 3.

A fifth voltage V5 is applied to word lines WL1 to WL4. Fifth voltage V5 can be a ground voltage or any voltage higher than erase voltage VERS. Current flows to second bit line BL2 from word lines WL1 to WL4 via memory cells connected to second bit line BL2. Erase voltage VERS gradually decreases, and memory cells connected to second bit line BL2 are gradually programmed. That is, the memory cells connected to second bit line BL2 are programmed in the incremental step pulse erase manner. Thus, the memory cells connected to second bit line BL2 are programmed to have a resistance value within a normal range even with deterioration.

Figure 13:
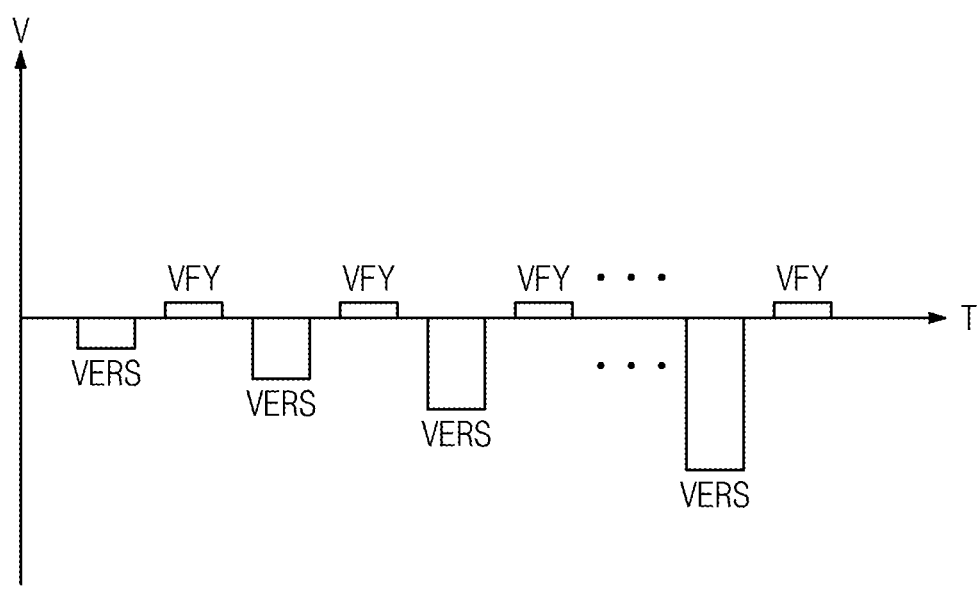
FIG. 13 is a diagram illustrating an erase voltage and a verification voltage applied to a selected bit line in the method of FIG. 11 according to an embodiment of the inventive concept.

FIG. 13 is a diagram illustrating an erase voltage and a verification voltage applied to a selected bit line in the method of FIG. 11 according to an embodiment of the inventive concept. In FIG. 13, a horizontal axis represents time and a vertical axis represents voltage.

Referring to FIG. 13, an erase voltage VERS and a verification voltage VFY are applied to second bit line BL2 in turn. Erase voltage VERS has a negative level that gradually decreases, and verification voltage VFY has a positive fixed level. Erase voltage VERS is generated by a power supply 151 in FIG. 7, and is supplied to a column selector 130 or a write driver and sense amplifier block 140.

Figure 14:
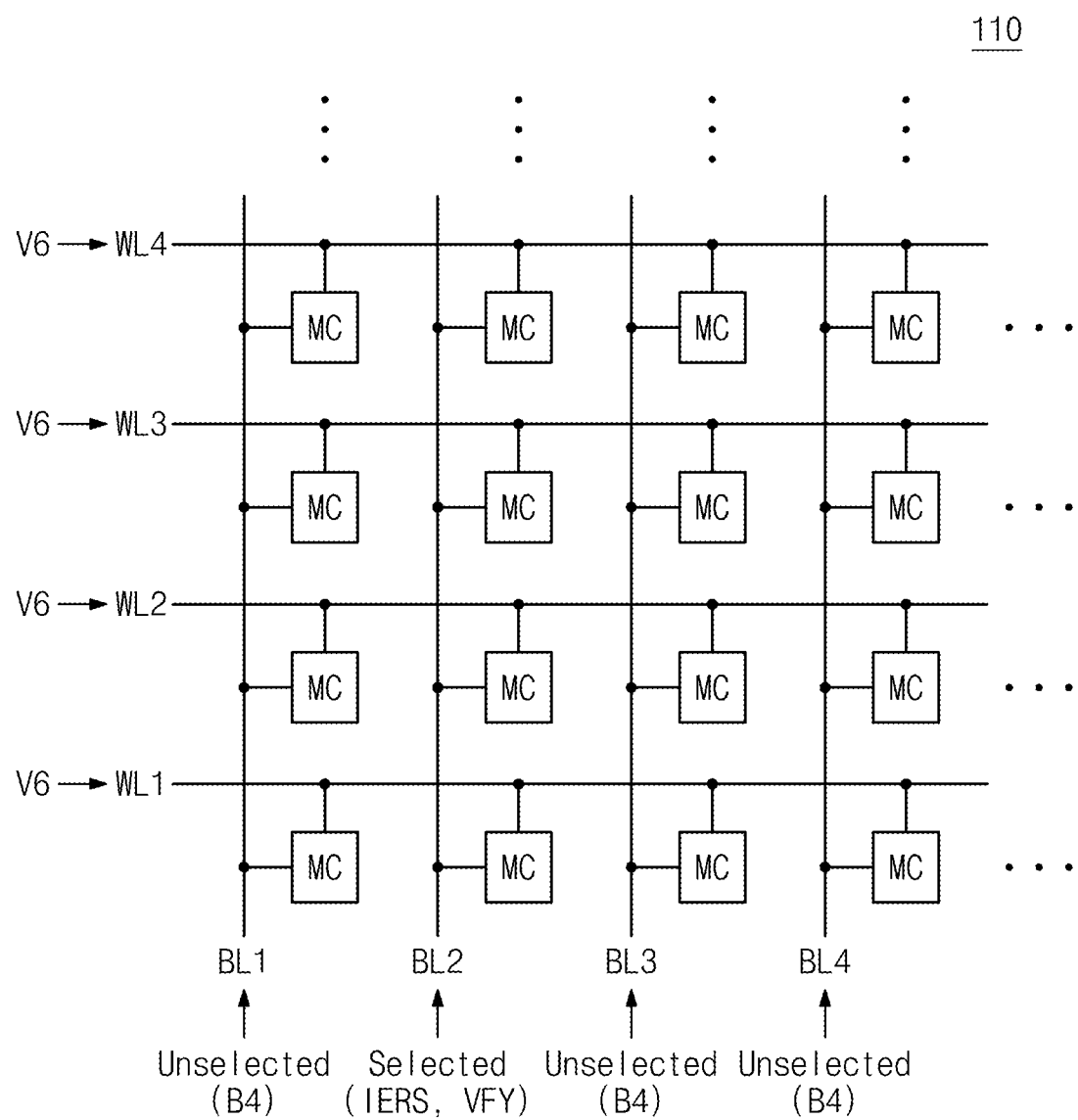
FIG. 14 is a diagram illustrating bias conditions of a memory cell array in the method of FIG. 11 according to another embodiment of the inventive concept.

FIG. 14 is a diagram illustrating another bias condition of a memory cell array in the method in FIG. 11 according to another embodiment of the inventive concept. In FIG. 14, it is assumed that a second bit line BL2 is selected.

Referring to FIG. 14, an erase voltage VERS and a verification voltage VFY are applied to second bit line BL2 in turn. Erase voltage VERS produces a negative current that gradually decreases, and verification voltage VFY is a positive voltage having a fixed level. The verification voltage can be a lowest voltage, a highest voltage, an intermediate voltage, or any voltage of a read period of a hysteresis curve in FIG. 3.

A sixth voltage V6 is applied to word lines WL1 to WL4. Sixth voltage V6 can be a ground voltage or any other voltage. Current flows to second bit line BL2 from word lines WL1 to WL4 via memory cells connected to second bit line BL2. Erase voltage VERS gradually decreases. As erase voltage VERS gradually decreases, memory cells connected to second bit line BL2 are gradually programmed. That is, the memory cells connected to second bit line BL2 are programmed by the incremental step pulse erase manner. Thus, the memory cells connected to second bit line BL2 are programmed to have a resistance value within a normal range even with deterioration.

Figure 15:
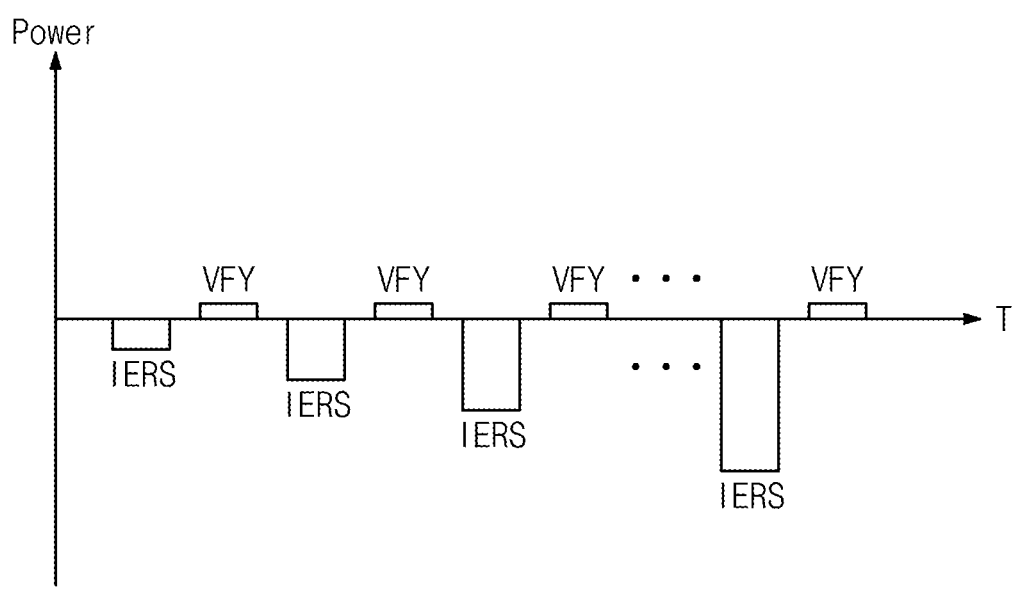
FIG. 15 is a diagram illustrating an erase voltage and a verification voltage applied to a selected bit line in the method of FIG. 11 according to another embodiment of the inventive concept.

FIG. 15 is a diagram illustrating an erase voltage and a verification voltage applied to a selected bit line. In FIG. 15, a horizontal axis represents time and a vertical axis represents power level.

Referring to FIG. 15, an erase voltage VERS and a verification voltage VFY are applied to second bit line BL2 in turn. Erase voltage VERS has a negative level that gradually decreases, and verification voltage VFY has a positive fixed level. Erase voltage VERS is generated by a power supply 151 in FIG. 10 and is supplied to a column selector 130 or a write driver and sense amplifier block 140.

As indicated by the foregoing, memory cells are programmed by a program voltage or a program current having a negative level gradually decreasing and are erased by an erase voltage or an erase current having a negative level gradually decreasing. Thus, a resistive memory device 100 with the improved reliability may be provided. In certain embodiments described above, memory cells connected to a single word line or bit line are programmed or erased. However, memory cells connected to two or more word lines or bit lines can be programmed or erased at the same time.

Figure 16:
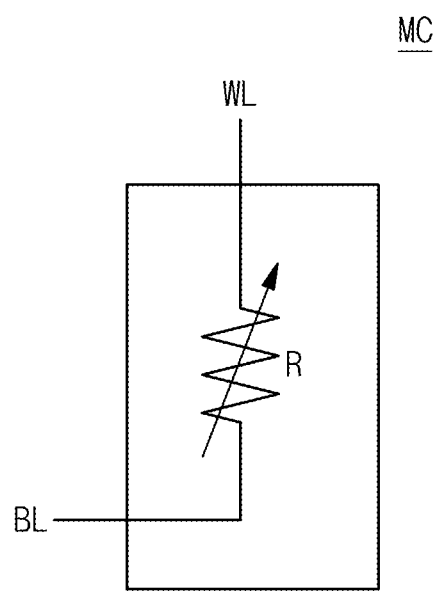
FIG. 16 is a diagram illustrating a memory cell according to an embodiment of the inventive concept.

FIG. 16 is a diagram illustrating a memory cell according to an embodiment of the inventive concept.

Referring to FIG. 16, a memory cell MC has a variable resistor R. Variable resistor R has a resistance value corresponding to a hysteresis curve in FIG. 3 according to a voltage or a current applied to a word line WL and a bit line BL.

Figure 17:
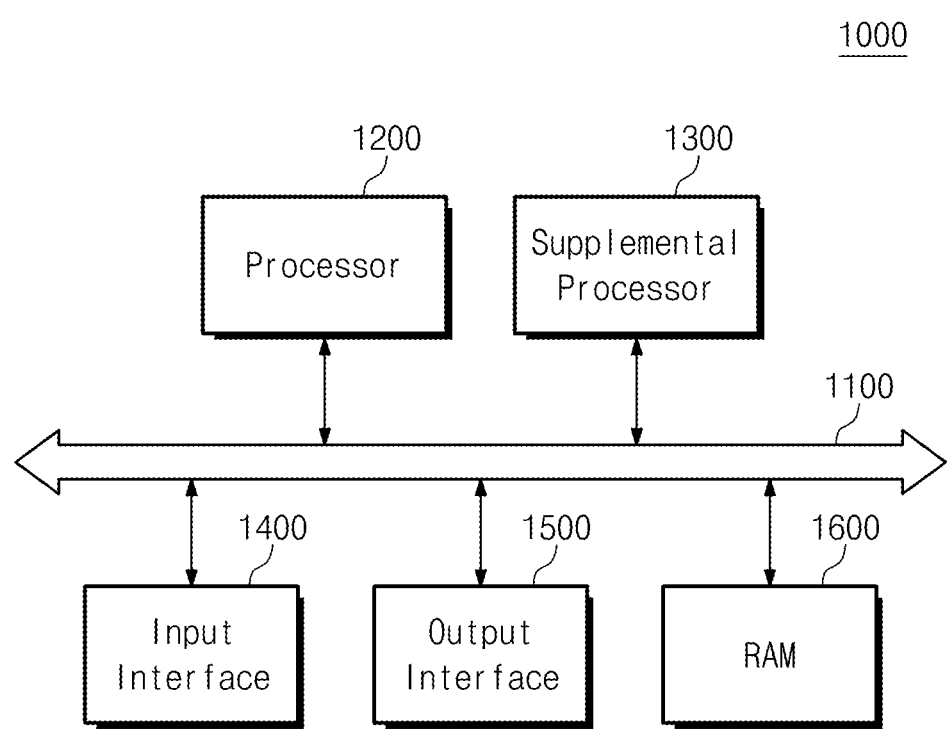
FIG. 17 is a block diagram illustrating a computing system according to an embodiment of the inventive concept.

FIG. 17 is a block diagram illustrating a computing system according to an embodiment of the inventive concept.

Referring to FIG. 17, a computing system 1000 comprises a system bus 1100, a processor 1200, a supplemental processor 1300, an input interface 1400, an output interface 1500, and a RAM 1600.

System bus 1100 provides channels among elements of computing system 1000. Processor 1200 is configured to control overall operations of computing system 1000. Processor 1200 typically comprises a general-purpose processor or an application processor (AP).

Supplemental processor 1300 is configured to supplement operations of processor 1200. Supplemental processor 1300 may comprise, for instance, an image processor (or, codec), a sound processor (or, codec), a compression or de-compression processor (or, codec), an encoding or decoding processor (or, codec).

Input interface 1400 comprises devices receiving signals from an external device. Input interface 1400 typically comprises at least one input device such as a button, a keyboard, a mouse, a microphone, a camera, a touch panel, a touch screen, or a wire/wireless receiver.

Output interface 1500 comprises an output device that provides signals for external devices. For example, output interface 1500 may comprise at least one output device such as a monitor, a ramp, a speaker, a printer, a motor, or a wire/wireless transmitter.

RAM 1600 is used as a working memory of computing system 1000. RAM 1600 may comprise a resistive memory device 100 described in relation to FIG. 1. Where resistive memory device 100 is applied to computing system 1000, the reliability of computing system 1000 may be improved.

Figure 18:
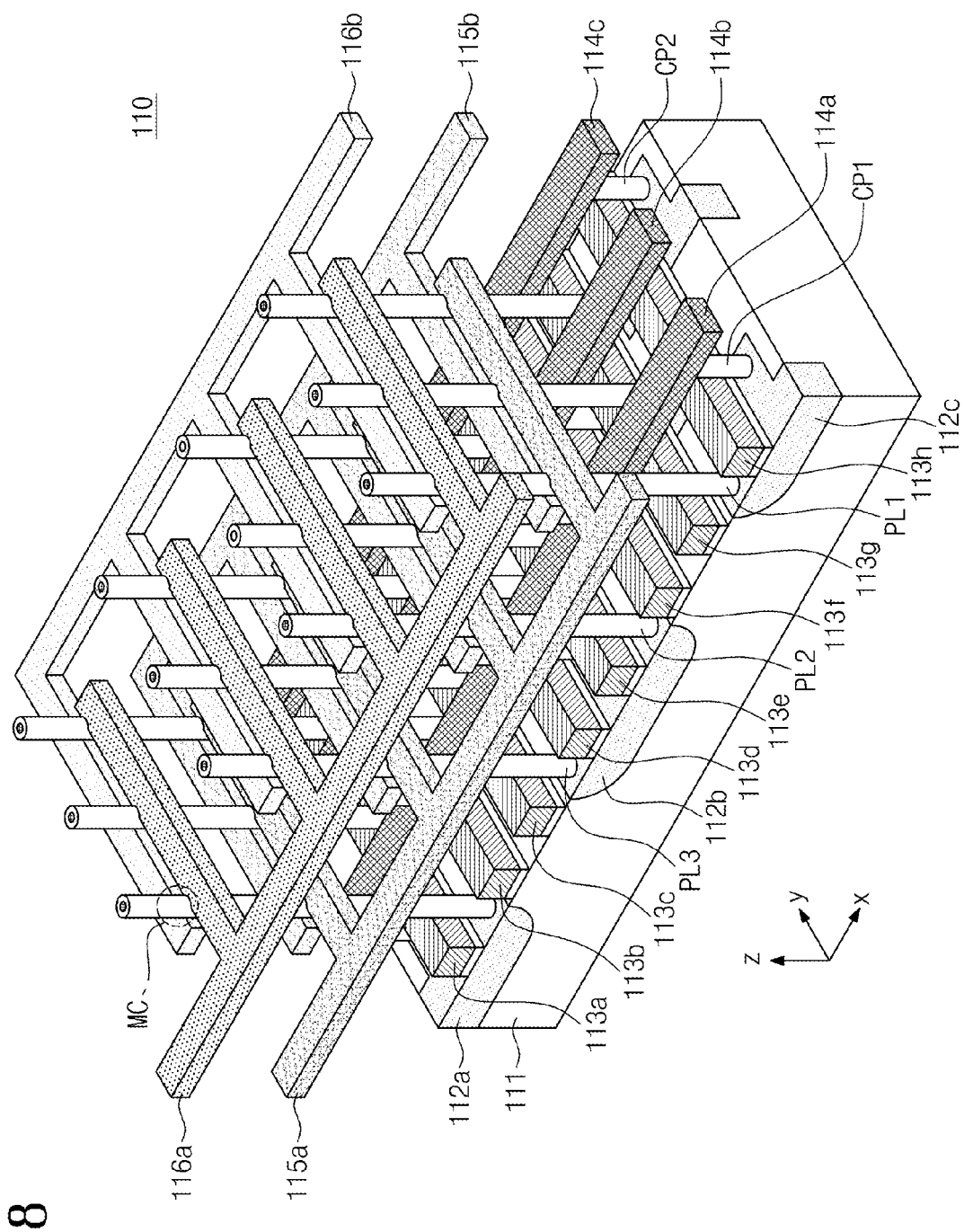
FIG. 18 is a perspective view illustrating a three-dimensional structure of a memory cell array in the resistive memory device of FIG. 1 according to an embodiment of the inventive concept.

FIG. 18 is a perspective view illustrating a three-dimensional structure of a memory cell array 110 of FIG. 1 according to an embodiment of the inventive concept.

Referring to FIG. 18, memory cell array 110 comprises structures extending along multiple directions x, y, and z. A substrate 111 is provided to form memory cell array 110. For example, substrate 111 may be formed of a p-well in which an element such as boron is injected. Alternatively, substrate 111 may be a pocket p-well provided within an n-well. Hereinafter, it is assumed that substrate 111 is a p-well. However, substrate 111 is not limited thereto.

Multiple doping regions 112a to 112c are formed in substrate 111. For example, doping regions 112a to 112c may be formed of an n-type conductor different from substrate 111. However, the inventive concept is not limited thereto. Doping regions 112a to 112c are formed sequentially in the x-axis direction. This structure is repeated in the y-axis direction. Word lines 113a to 113h connected to metal lines formed at multiple layers are formed over doping regions 112a to 112c to be electrically isolated from doping regions 112a to 112c.

Doping regions 112a to 112c are connected by multiple bit lines 114a to 114c extending in the x-axis direction and contact plugs CP1 and CP2. Doping regions 112a to 112c are connected with bit lines 114a to 114c and vertical electrodes of multiple pillars PL1 to PL4. That is, bit lines are connected to vertical electrodes of pillars PL1 to PL4 by doping regions 112a to 112c. Each of pillars PL1 to PL4 are connected with metal lines 115a, 115b, 116a, and 116b stacked at multiple layers. Metal lines 115a and 115b connected to pillars at multiple metal layers in a comb shape are connected to a global word line.

Memory cell array 110 is formed according to the above description to have a three-dimensional structure. However, the inventive concept is not limited thereto, and resistive memory cells can be stacked in various alternative ways.

Figure 19:
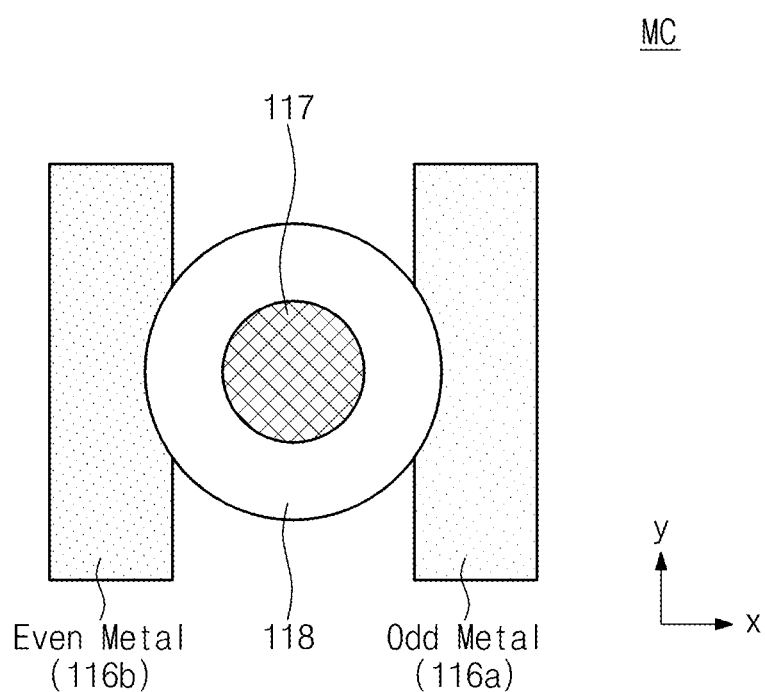
FIG. 19 is a cross-sectional view of a variable resistance memory cell formed in a layer of the structure illustrated in FIG. 18 according to an embodiment of the inventive concept.

FIG. 19 is a cross-sectional view of a variable resistance memory cell formed at one layer in FIG. 18.

Referring to FIG. 19, a memory cell MC comprises a pillar arranged in a direction (a z-axis direction) perpendicular to a substrate and formed between metal lines 116a and 116b forming a horizontal electrode. The pillar comprises a data storing film 118 and a vertical electrode 117 that are formed in a cylindrical shape. A variable resistance memory cell is formed by vertical electrode 117 connected to a bit line and metal lines 116a and 116b connected to a word line. Data storing film 118 is formed by etch and deposition processes into a vertical direction. Vertical electrode 117 can be formed by a deposition process, for example, physical vapor deposition (PVD), chemical vapor deposition (CVD), or atomic vapor deposition (AVD).

Figure 20:
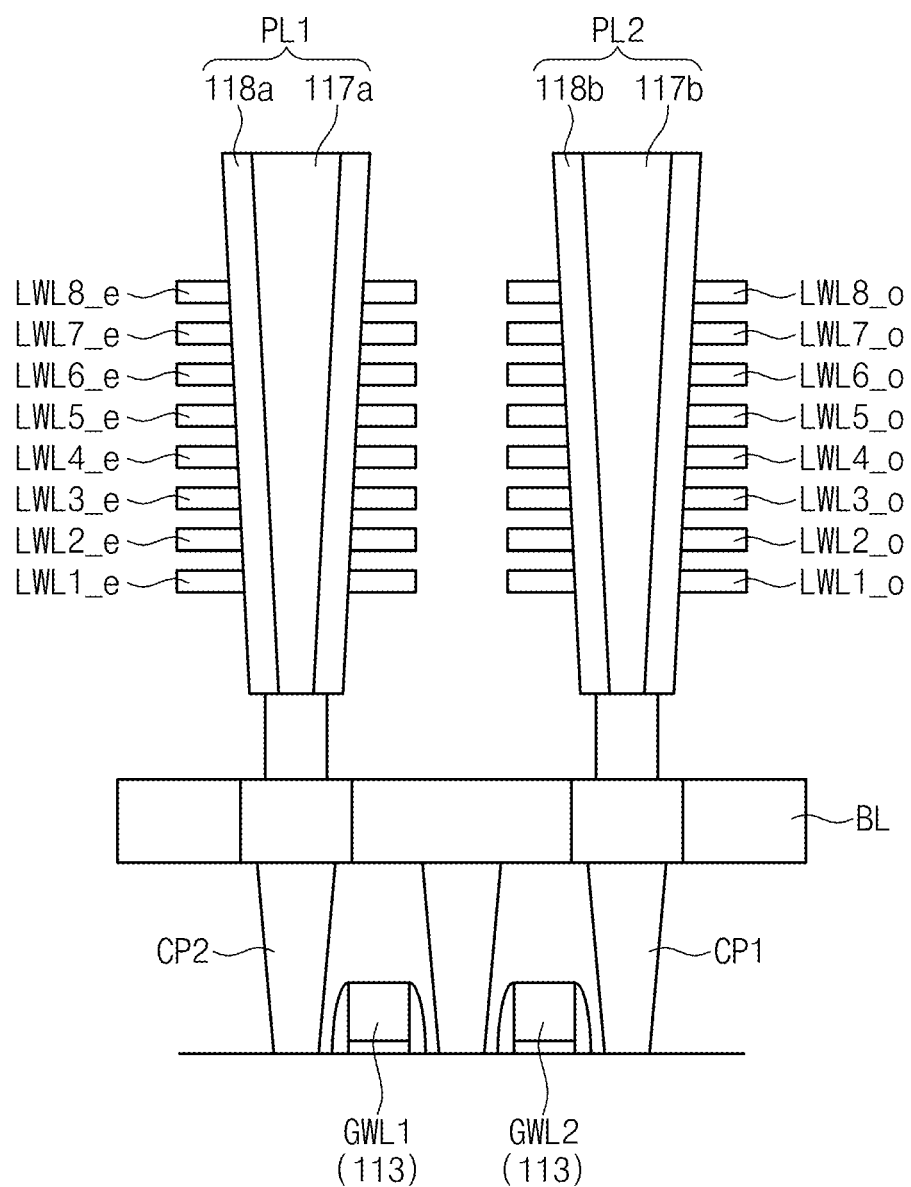
FIG. 20 is a cross-section view of a memory cell array illustrated in FIG. 18 according to an embodiment of the inventive concept.

FIG. 20 is a cross-sectional view of memory cell array 110 shown in FIG. 18 according to an embodiment of the inventive concept.

Referring to FIG. 20, memory cell array 110 comprises pillars PL1 and PL2 forming a vertical electrode and a variable resistance memory cell, multiple horizontal electrodes LWL1_e to LWL8_e and LWL1_o to LWL8_o stacked in a direction perpendicular to a substrate, bit lines connected to bit lines via doping regions, and global word lines GWL1 and GWL2 for providing a word line voltage to multiple horizontal electrodes.

Figure 21:
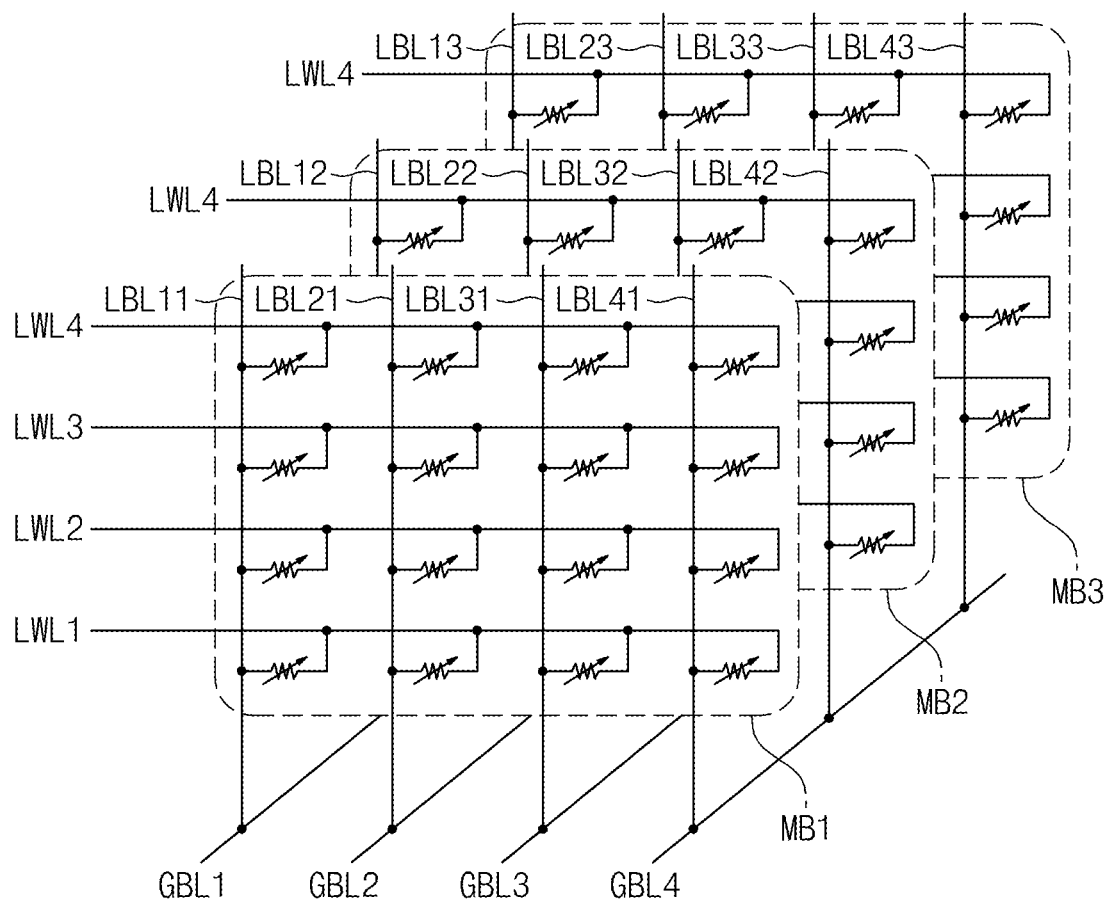
FIG. 21 is a circuit diagram of the memory cell array of FIG. 18 according to an embodiment of the inventive concept.

FIG. 21 is a circuit diagram of memory cell array 110 in FIG. 18 according to an embodiment of the inventive concept.

Referring to FIG. 21, memory cell array 110 comprises multiple memory blocks MB1 to MB3 that form one unit at an x-z plane.

Memory cell array 110 comprises multiple local bit lines extending in parallel in a z-axis direction and multiple local word lines LWL1 to LWL4 extending in parallel in a y-axis direction perpendicular to the z-axis direction. Although not shown in figures, each of memory blocks MB1 to MB3 may be connected to different local word lines.

Local bit lines LBL11 to LBL43 formed by vertical channels of pillars are connected to global bit lines GBL1 to GBL4, respectively. Variable resistive memory cells of memory cell array 110 are connected to local word lines LWL1 to LWL4 or local bit lines LBL11 to LBL43. Variable resistive memory cells are programmed or sensed by voltages applied to local word lines LWL1 to LWL4 or local bit lines LBL11 to LBL43.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A resistive memory device, comprising:
   a memory cell array comprising a plurality of memory cells connected to a plurality of word lines and a plurality of bit lines;
   a row selector connected to the plurality of word lines; and
   a column selector connected to the plurality of bit lines;
   wherein, in a program operation, the row selector provides a selected word line with program pulse and a verification pulse in each of multiple program loops, wherein the verification pulse has a substantially fixed level through the program loops and the program pulse has a negative value that decreases incrementally between successive program loops.

2. The resistive memory device of claim 1, wherein the program pulse comprises a program voltage or a program current.

3. The resistive memory device of claim 1, wherein the row selector is further configured to apply a program voltage to the selected word line in the program operation.

4. The resistive memory device of claim 3, wherein, during the program operation, the column selector biases the plurality of bit lines such that a current flows to the selected word line from the plurality of bit lines via memory cells connected to the selected word line.

5. The resistive memory device of claim 4, wherein, during the program operation, the column selector applies a ground voltage to the plurality of bit lines.

6. The resistive memory device of claim 4, wherein, during the program operation, the row selector biases unselected word lines such that memory cells connected to the unselected word lines are not programmed.

7. The resistive memory device of claim 6, wherein, during the program operation, the row selector floats the unselected word lines.

8. The resistive memory device of claim 6, wherein the row selector is configured to apply a specific voltage to the unselected word lines during the program operation.

9. The resistive memory device of claim 3, further comprising:
   a plurality of resistors connected in series between a node supplied with a negative voltage and ground;
   a plurality of transistors connected in parallel with the plurality of resistors, respectively;
   a decoder configured to control the plurality of transistors; and
   a driver configured to transfer a voltage of one of connection nodes of the plurality of resistors to the row selector as the program voltage.

10. The resistive memory device of claim 1, wherein the row selector is further configured to apply a program current to the selected word line during the program operation.

11. The resistive memory device of claim 10, further comprising:
   a plurality of current source and transistor pairs connected in parallel between a first node and a second node;
   a decoder configured to control transistors in the plurality of pairs, respectively; and
   a current minor configured to minor a current flowing to the second node so as to be transferred to the column selector as the program current.

12. A resistive memory device comprising:
   a memory cell array comprising a plurality of memory cells connected to a plurality of word lines and a plurality of bit lines;
   a row selector connected to the plurality of word lines; and
   a column selector connected to the plurality of bit lines;
   wherein, in an erase operation, the column selector provides a selected bit line with an erase pulse and a verification pulse in each of multiple program loops, wherein the verification pulse has a substantially fixed level through the program loops and the erase pulse has a negative value that decreases incrementally between successive program loops.

13. The resistive memory device of claim 12, wherein in the erase operation, the column selector applies an erase voltage to the selected bit line.

14. The resistive memory device of claim 12, wherein, in the erase operation, the column selector applies an erase current to the selected bit line.

15. The resistive memory device of claim 12, wherein, in the erase operation, the row selector biases the plurality of word lines such that a current flows to the selected bit line from the plurality of word lines via memory cells connected to the selected bit line.

16. The resistive memory device of claim 12, wherein the erase pulse comprises an erase voltage or an erase current.

17. A method of operating a resistive memory device, the method comprising:
   performing a plurality of program loops each comprising applying a program pulse and a verification pulse to selected memory cells, wherein the verification pulse has a substantially fixed level through the plurality of program loops and the program pulse has a value that decreases incrementally between successive program loops.

18. The method of claim 17, wherein the selected memory cells are connected to a selected wordline and selected bit lines, and the method further comprises, during the program loops, biasing the selected bit lines such that current flows from the selected bitlines to the selected word line via the selected memory cells.

19. The method of claim 17, wherein the program pulse comprises a program voltage or a program current.

20. The method of claim 17, wherein the selected memory cells are connected to a selected wordline and selected bit lines, and unselected memory cells are connected to unselected wordlines, and the method further comprises, during the program loops, applying a ground voltage to the selected bit lines, and floating the unselected word lines.

* * * * *